(12) United States Patent
Jan et al.

(10) Patent No.: US 10,756,210 B2
(45) Date of Patent: Aug. 25, 2020

(54) DEPLETION MODE GATE IN ULTRATHIN FINFET BASED ARCHITECTURE

(71) Applicant: Intel Corporation, Santa Clara, CA (US)

(72) Inventors: Chia-Hong Jan, Portland, OR (US); Walid M. Hafez, Portland, OR (US); Hsu-Yu Chang, Hillsboro, OR (US); Neville L. Dias, Hillsboro, OR (US); Rahul Ramaswamy, Portland, OR (US); Roman W. Olac-Vaw, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/317,708

(22) PCT Filed: Sep. 30, 2016

(86) PCT No.: PCT/US2016/055004
§ 371 (c)(1),
(2) Date: Jan. 14, 2019

(87) PCT Pub. No.: WO2018/063394
PCT Pub. Date: Apr. 5, 2018

(65) Prior Publication Data
US 2020/0066907 A1  Feb. 27, 2020

(51) Int. Cl.
*H01L 51/05* (2006.01)
*H01L 29/78* (2006.01)
(Continued)

(52) U.S. Cl.
CPC .... *H01L 29/7838* (2013.01); *H01L 29/66795* (2013.01); *H01L 29/785* (2013.01); *H01L 29/786* (2013.01); *H01L 2029/7857* (2013.01)

(58) Field of Classification Search
CPC ......... H01L 29/66757; H01L 29/66765; H01L 29/66795; H01L 29/7851; H01L 51/0541;
(Continued)

(56) References Cited

U.S. PATENT DOCUMENTS 5,837,588 A * 11/1998 Wu ..................... H01L 21/2652
438/305
2008/0197382 A1  8/2008 Sriram et al.
(Continued)

OTHER PUBLICATIONS

International Preliminary Report on Patentability for International Patent Application No. PCT/US2016/055004, dated Apr. 11, 2019, 6 pgs.
(Continued)

*Primary Examiner* — Hoai V Pham
(74) *Attorney, Agent, or Firm* — Schwabe, Williamson & Wyatt, P.C.

(57) ABSTRACT

A transistor device including a transistor including a body disposed on a substrate, a gate stack contacting at least two adjacent sides of the body and a source and a drain on opposing sides of the gate stack and a channel defined in the body between the source and the drain, wherein a conductivity of the channel is similar to a conductivity of the source and the drain. An input/output (IO) circuit including a driver circuit coupled to the logic circuit, the driver circuit including at least one transistor device is described. A method including forming a channel of a transistor device on a substrate including an electrical conductivity; forming a source and a drain on opposite sides of the channel, wherein the source and the drain include the same electrical conductivity as the channel; and forming a gate stack on the channel.

10 Claims, 17 Drawing Sheets

(51) Int. Cl.
　　　*H01L 29/66*　　　(2006.01)
　　　*H01L 29/786*　　　(2006.01)
(58) Field of Classification Search
　　　CPC ............. H01L 51/0558; H01L 51/0562; H01L 27/14616
　　　See application file for complete search history.

(56) References Cited

U.S. PATENT DOCUMENTS

| | | |
|---|---|---|
| 2012/0007180 A1 | 1/2012 | Yin et al. |
| 2012/0080729 A1 | 4/2012 | Fujikawa |
| 2015/0214355 A1 | 7/2015 | Nakano et al. |
| 2018/0372126 A1 | 12/2018 | Bunin et al. |

OTHER PUBLICATIONS

International Search Report and Written Opinion for International Patent Application No. PCT/US2016/055004 dated Jun. 27, 2017, 9 pgs.

* cited by examiner

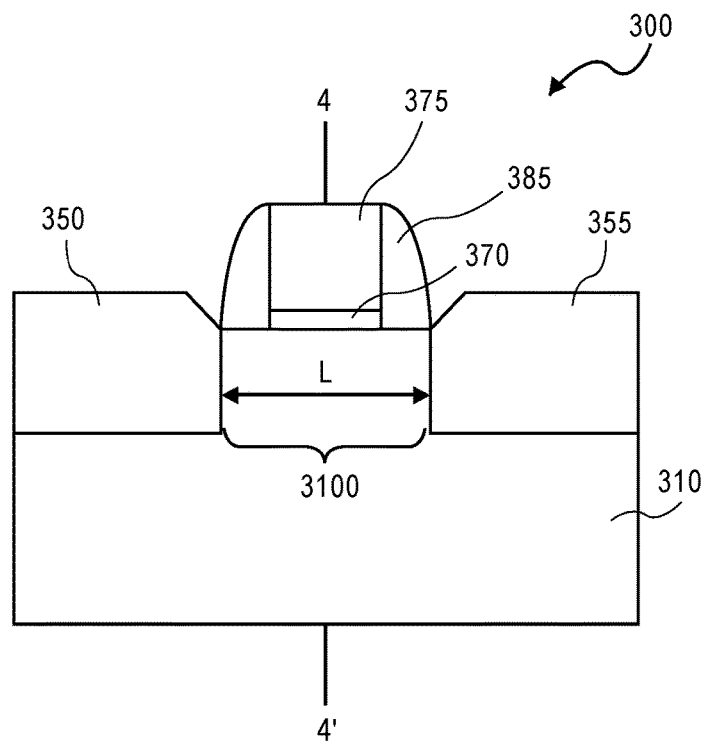
FIG. 3
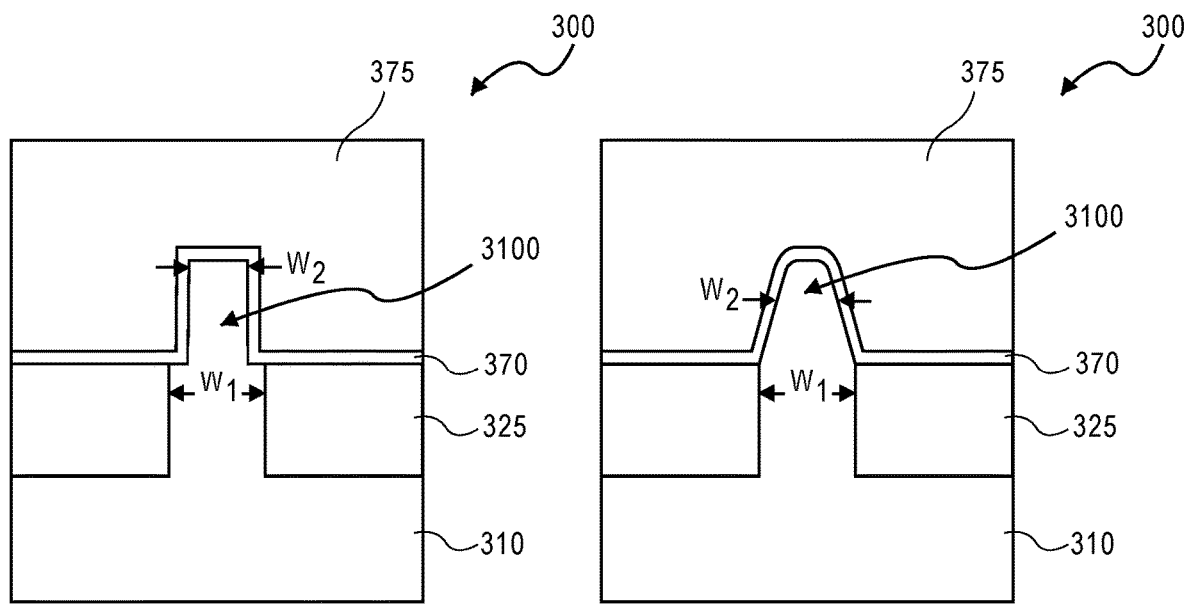
FIG. 4A  FIG. 4B

DEPLETION MODE GATE IN ULTRATHIN FINFET BASED ARCHITECTURE

CROSS-REFERENCE TO RELATED APPLICATION

This patent application is a U.S. National Phase Application under 35 U.S.C. § 371 of International Application No. PCT/US2016/055004, filed Sep. 30, 2016, entitled "DEPLETION MODE GATE IN ULTRATHIN FINFET BASED ARCHITECTURE," which designates the United States of America, the entire disclosure of which is hereby incorporated by reference in its entirety and for all purposes.

BACKGROUND

Field

Integrated circuit devices.

Description of Related Art

Conventional high voltage transistors such as input/output (IO) transistors suffer from hot carrier issues arising from minority carrier collisions with dopants in the channel. This effect is aggravated by the generally high source/drain bias usually applied to such devices. In addition, the long channel lengths required to support high source/drain bias result in lower drive strengths.

BRIEF DESCRIPTION OF THE DRAWINGS

FIG. 3 shows a cross-sectional side view of an embodiment of a field effect transistor (FET) device such as a metal oxide semiconductor FET (MOSFET).

FIG. 4A shows one embodiment of the device through line 4-4' of FIG. 3.

FIG. 4B shows another embodiment of the device through line 4-4' of FIG. 3.

DETAILED DESCRIPTION

A depletion mode transistor device is described. In one embodiment, the depletion mode transistor device is a non-planar or three-dimensional transistor including a transistor body or fin on a substrate, a gate stack contacting at least two adjacent sides of the body and a source and a drain on opposing sides of the gate stack and a channel defined in the body or fin between the source and the drain. The channel of the transistor device has a conductivity (e.g., p or n conductivity) that is similar to a conductivity of the source and the drain. As a depletion mode device, the transistor device is conductive when a gate source voltage is zero. An input/output (IO) circuit including one or more depletion mode transistors is also described.

Figure 1:
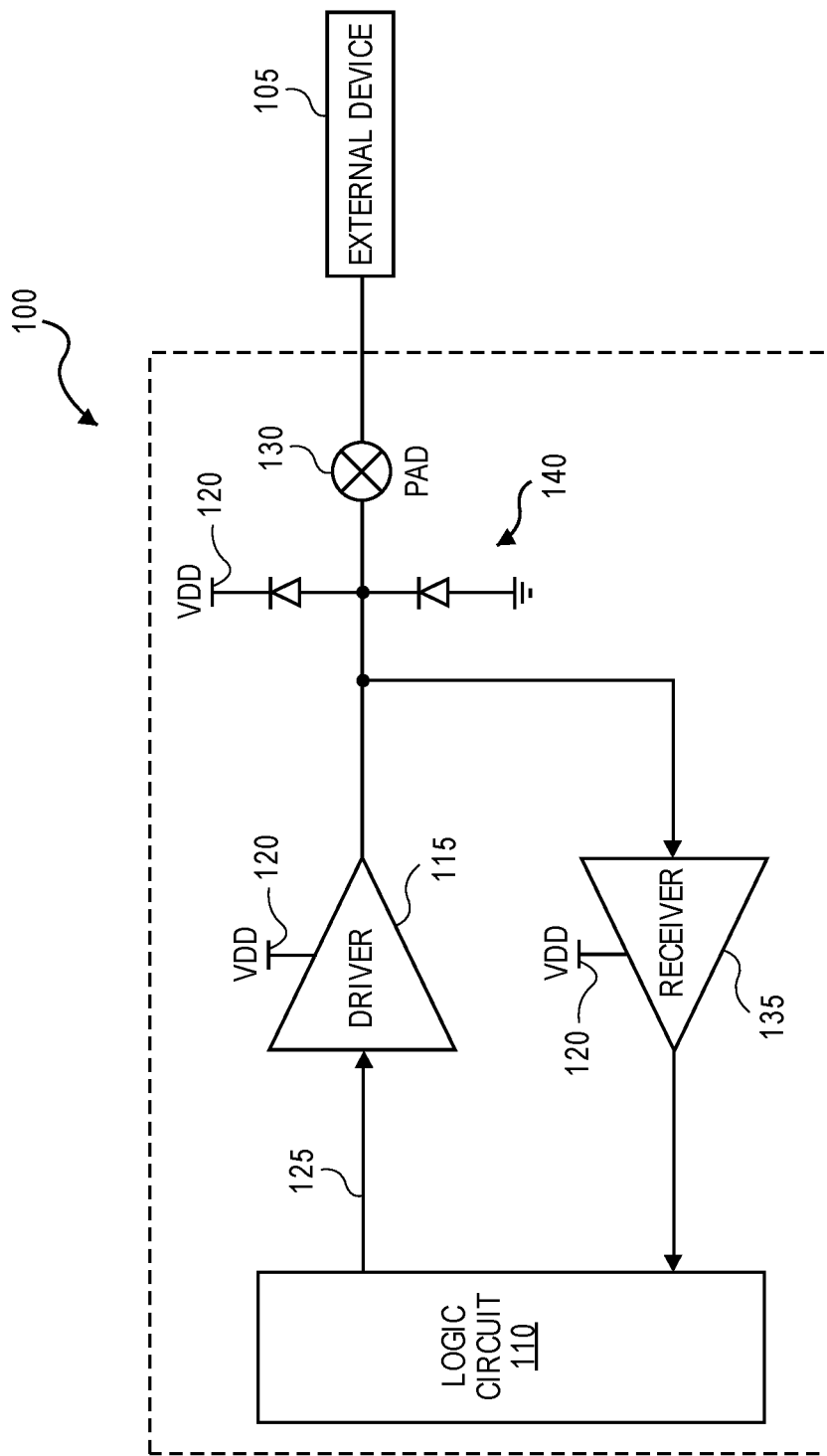
FIG. 1 shows a block diagram of an input/output (IO) circuit in an integrated circuit.

FIG. 1 shows a block diagram of an input/output (IO) circuit in an integrated circuit. In this embodiment, IO circuit 100 includes logic circuit 110 connected to driver circuit 115 and is operable to provide input 125 to driver circuit 115. Driver circuit 115 is powered by supply voltage 120. Driver circuit 115 is also connected to pad 130 that is operable to be connected to external device 105 through, for example, a transmission line. In one embodiment, logic circuit 110 generates output 125 that is provided to driver circuit 115. Driver circuit 115 is used to for sending signals to external device 105 in a transmission mode. IO circuit 100 also includes receiver circuit 135. Receiver circuit 135 is connected to pad 130 and is powered by supply voltage 120. Receiver circuit 135 is operable to provide an output to logic circuit 110. Receiver circuit 135 is used for receiving signals from external device 105 in a receive mode. In this embodiment, IO circuit 100 also includes electro-static discharge (ESD) circuit 140 connected between pad 130 and driver circuit 115/receiver circuit 135.

Figure 2:
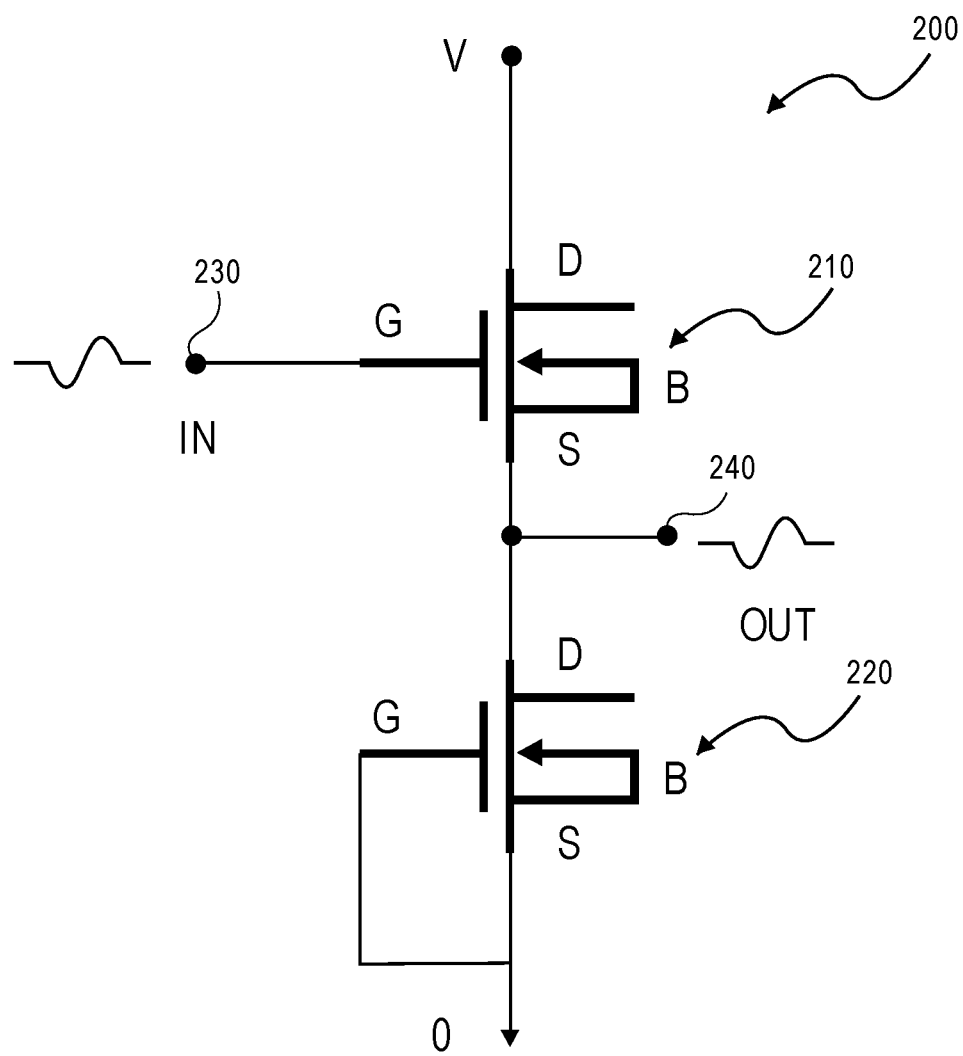
FIG. 2 shows an application of depletion mode transistor devices in a buffer circuit.

In the embodiment of an IO circuit described above with reference to FIG. 1, IO circuit 100 acts as an interface between core logic circuits and an external device. Typically core logic circuits require a low voltage (e.g., 2.5 volts). Some peripheral components or external devices operate at higher voltages (e.g., 3.3 volts, 5 volts). To interface with such devices, IO circuit 100 includes one or more high voltage IO transistors (e.g., a transistor that can function at a voltage of 3.3 volts or higher to achieve switching or maintain a logic state). Representatively, at least receiver circuit 135 in IO circuit 100 may include one or more high voltage IO transistors. In one embodiment, the one or more high voltage IO transistors operate in depletion mode. Operation in depletion mode permits conduction through a channel of such a transistor, particularly a non-planar or three-dimensional transistor (e.g., finfet), to occur through a majority or the entire channel cross-section and is not limited to surface conduction operation typically seen in enhancement mode devices. FIG. 2 shows an application of depletion mode transistor device in a simple circuit. FIG. 2 representatively shows a buffer circuit including transistor 210 and transistor 220, each a depletion mode transistor. This representative circuit helps to isolate input signal 230 from output voltage 240. Due to the high impedance of gate of transistor 210, very low current is drawn from input signal 230. Transistor 210 and transistor 220 (biased as a resistor) help to provide the power for output signal 240.

FIG. 3 shows a cross-sectional side view of an embodiment of a field effect transistor (FET) device such as a metal oxide semiconductor FET (MOSFET). FIG. 4A and FIG. 4B show different embodiments of the device through line 4-4' of FIG. 3. Referring to FIGS. 3 and 4A-4B, device 300 includes substrate 310 that is, for example, a single crystal silicon substrate. In this embodiment, a material of substrate 310 (e.g., silicon) is used as a channel material for a transistor device. FIG. 3 shows transistor device 300 includes diffusion region or source 350 and diffusion region or drain 355. For an NMOS device, representatively each source 350 and drain 355 are a $n^{++}$ doped material and for a PMOSFET, source 350 and drain 355 are $p^{++}$ doped material. Disposed between source 350 and drain 355 is channel 3100 of substrate 310. In one embodiment, channel 3100 is doped to be of the same conductivity type as a source and drain (e.g., doped n-type or an NMOS or p-type or a PMOS). In this embodiment, channel 3100 has a length dimension, L, on the order of 100 nanometers (nm) or greater (e.g., 100 nm to one micron).

Overlying channel 3100 is a gate stack including a gate dielectric and a gate electrode. FIGS. 3 and 4A-4B show gate dielectric layer 370. As shown in FIGS. 4A-4B, in this embodiment, the gate stack is in contact with each side of the channel (in contact with the top and opposing sidewalls of the channel as viewed). Gate dielectric 370 is, for example, a silicon dioxide or a dielectric material having a dielectric constant greater than silicon dioxide (a high-k material) or a combination of silicon dioxide and a high-k material or multiple high-k materials. Disposed on gate dielectric 370 is gate electrode 375. In one embodiment, gate electrode 375 is a metal or metal compound or alloy or a silicide. Examples of a material for gate electrode 374 include tungsten, titanium, tantalum or a nitride of tungsten, titanium and tantalum.

As illustrated in FIGS. 4A-4B, in one embodiment, transistor 300 is a non-planar depletion mode FET formed in a transistor body surrounded by dielectric layer 325 of, for example, silicon dioxide or a low-k dielectric material. A portion of the body including channel 3100 is disposed above the level of dielectric layer 325 as fin. In one embodiment, channel 3100 has a width, $W_2$, that is reduced relative to a width, $W_1$, of the body at an interface with dielectric layer 325 ($W_2 < W_1$). In one embodiment, channel 3100 has an average width, $W_2$, on the order of less than 10 nm, such as 2 nm to 6 nm. A width, $W_2$, of channel may vary along a height dimension where, for example, the channel width is reduced. A width of channel 3100 is made narrow relative to an enhancement or mode transistor device to allow relatively easy pinch off to turn the transistor off. Unlike enhancement mode transistors that are normally "off" devices, depletion mode transistors are "normally-on" and require no gate current to function. Channel 3100 is fully conductive and current flows between drain 355 and source 350 when gate 375 is at zero volts. Increasing a negative bias at gate 375 will reduce conduction in the channel until a threshold voltage is reached and conduction stops. Channel 3100 having an average width, $W_2$, less than 10 nm (e.g., 2 nm to 6 nm) improves device function (e.g., on/off states are improved). FIGS. 4A-4B illustrate that a profile of the channel may have a variety of shapes particularly after a process to form the channel or reduce a width of the channel as described herein. FIG. 4A shows channel 3100 having a generally rectangular profile while FIG. 4B shows channel 3100 with a curved apex and a generally salient base (i.e., a base of channel 3100 is wider than an apex).

Figure 5:
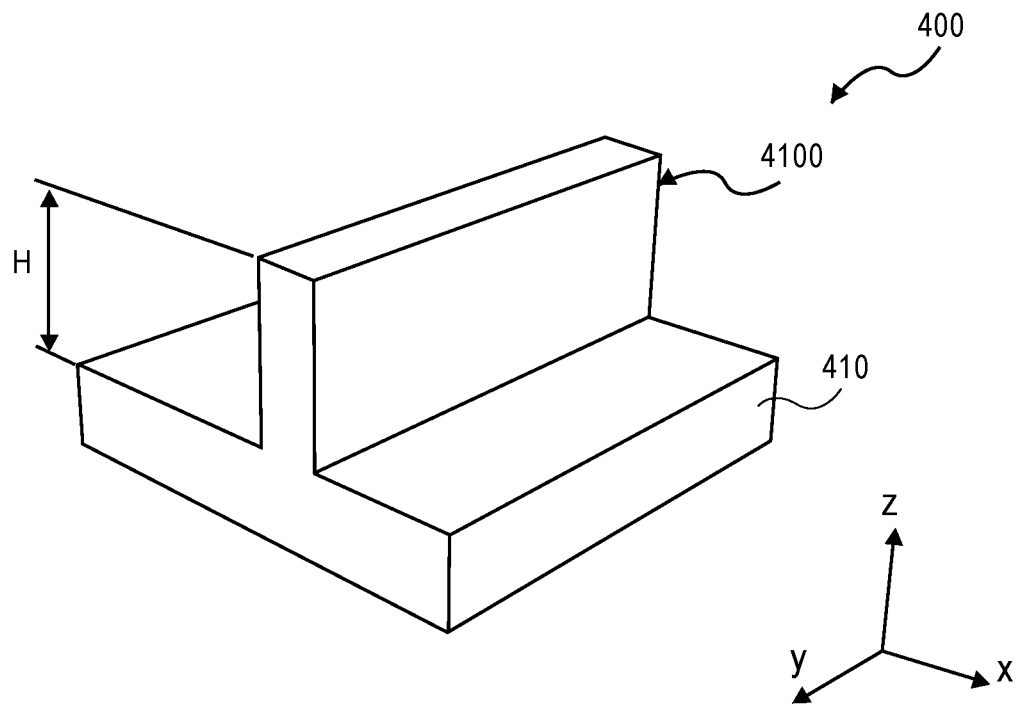
FIG. 5 shows a perspective side view of the structure including a substrate that may be any material that may serve as a foundation on which a multi-gate depletion mode FET may be constructed.
Figure 6:
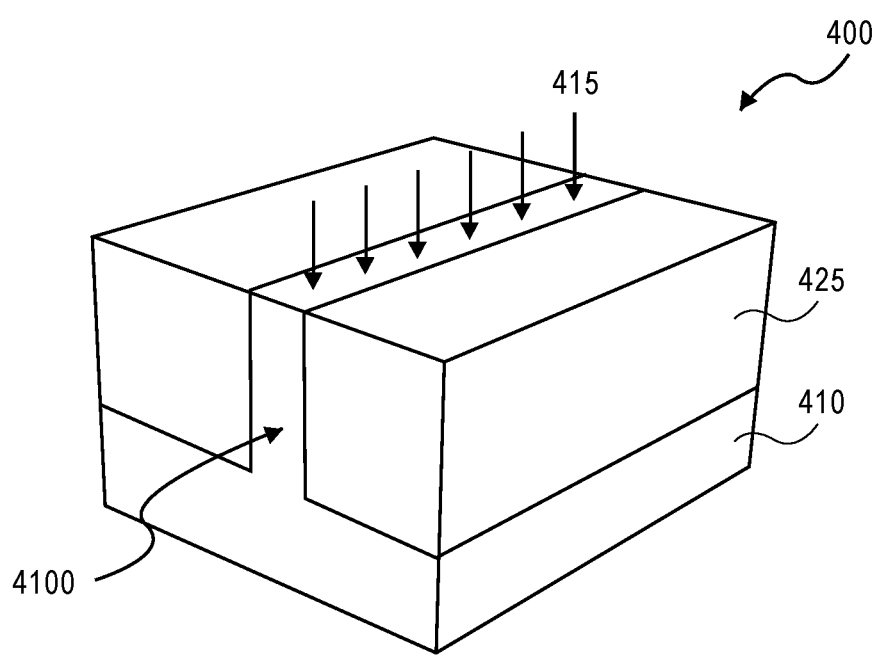
FIG. 6 shows the structure of FIG. 5 following a removal of the mask on the fin and following the deposition of dielectric layer on the substrate.
Figure 12:
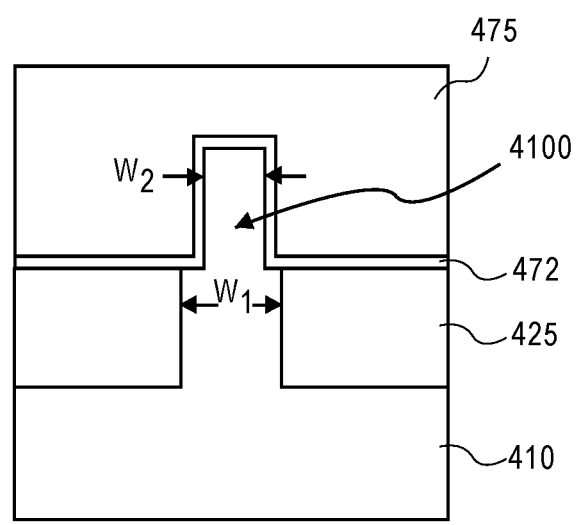
FIG. 12 shows the structure of FIG. 11 following the formation of a gate stack on the channel region of the fin.
Figure 13:
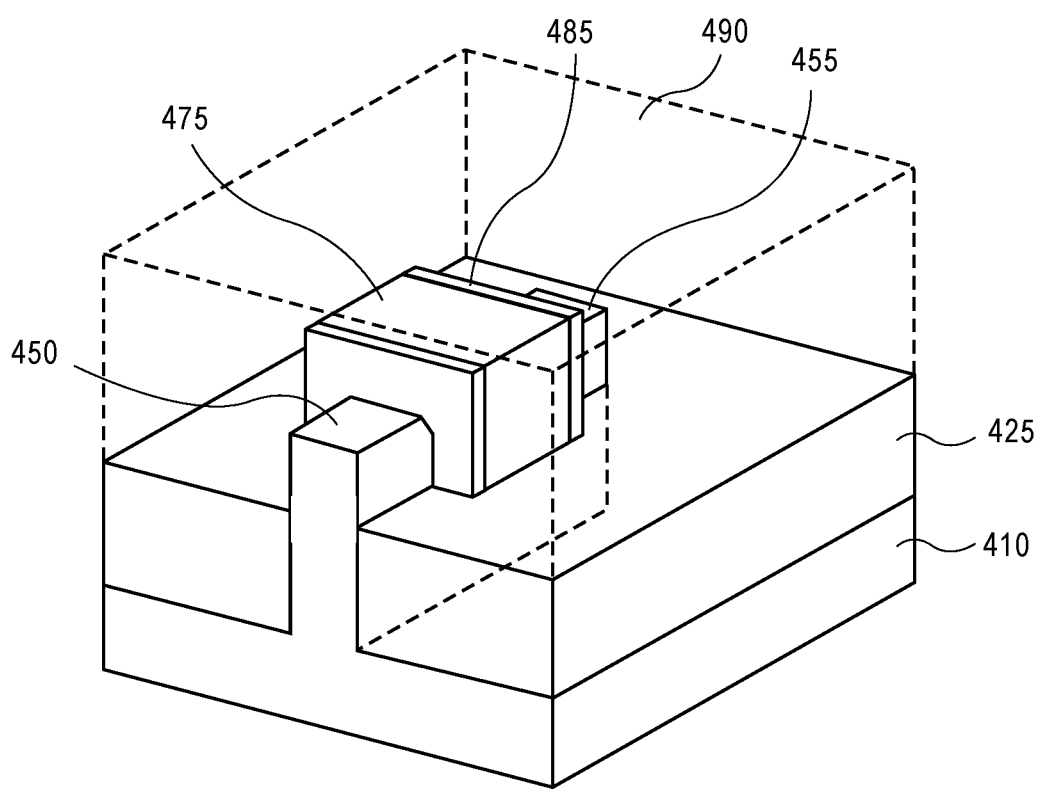
FIG. 13 shows a top side perspective of the structure of FIG. 12 following the deposition of a dielectric material on the structure.
Figure 14:
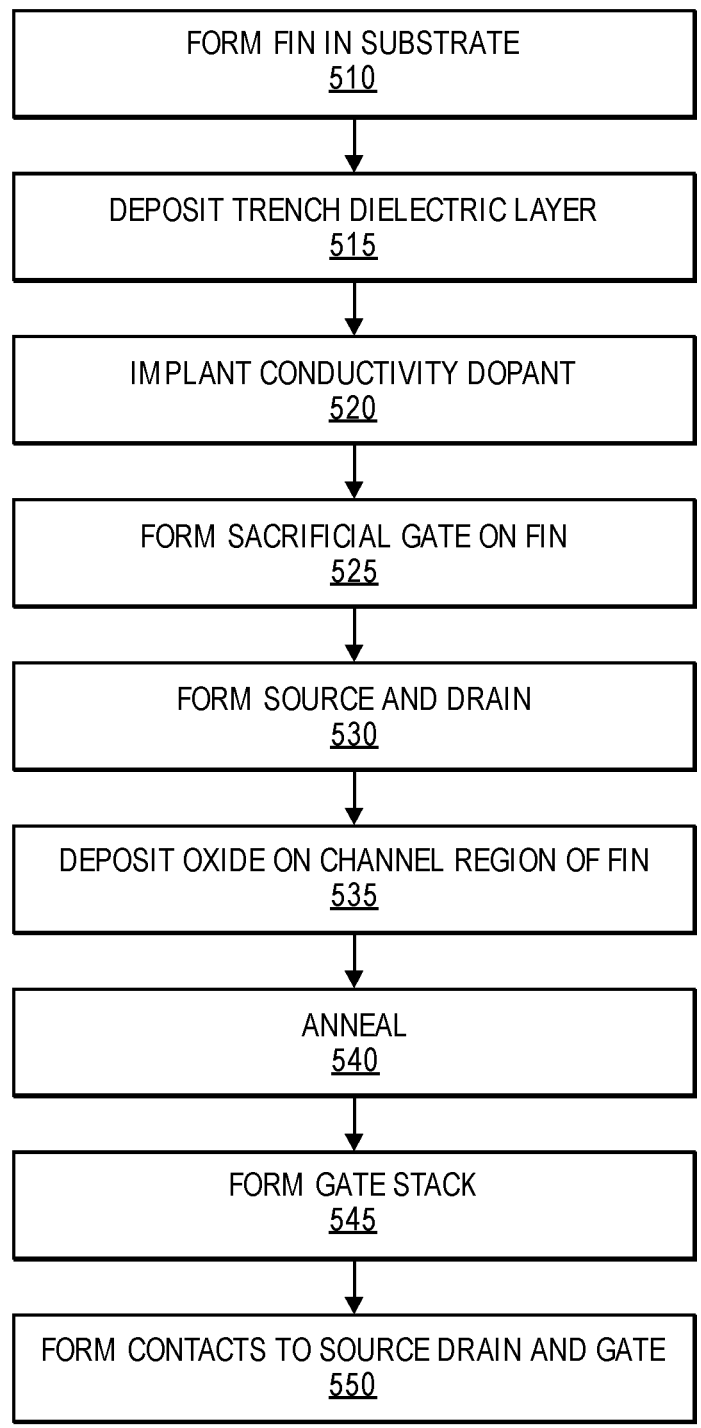
FIG. 14 presents a flow chart of the process describe with reference to FIGS. 5-12.

FIGS. 5-13 describe a process of forming a depletion mode FET such as illustrated in FIGS. 3-4. FIG. 14 presents a flow chart of the process. Referring to FIG. 5 and with reference to the flow chart of FIG. 14, the process begins by defining fin structures in a substrate material (block 510, FIG. 14). FIG. 5 shows a perspective side view of structure 400 including substrate 410 that may be any material that may serve as a foundation on which a multi-gate depletion mode FET may be constructed. Representatively, substrate 410 is a portion of a larger substrate such as a wafer. In one embodiment, substrate 410 is a semiconductor material such as single crystal silicon. Substrate 410 may be a bulk substrate or, in another embodiment, a semiconductor on insulator (SOI) structure. FIG. 5 shows substrate 410 following a patterning of the substrate to define transistor body or fin 4100. Fin 4100 may be formed by mask and etch process where, for example, a mask (e.g., a hardmask) is introduced on a surface (superior surface as viewed) of substrate 410 to protect the areas of the substrate where a fin will be defined to provide openings in non-fin areas. Once the mask is patterned, substrate 410 may be etched to remove material in unprotected areas. A substrate of silicon may be etched with a wet or dry etch. Representatively, a suitable etchant is chlorine or fluorine plasma based etch chemistry. In one embodiment, fin 4100 is etched to have a height, H, on the order of 100 nm to 400 nm. FIG. 6 shows the structure of FIG. 5 following a removal of the mask on the fin and following the deposition of a dielectric layer on the substrate on opposite sides of fin 4100 (block 515, FIG. 14). In one embodiment, dielectric layer 425 is silicon dioxide or a low-k dielectric material. Following deposition of dielectric layer 425, a surface of structure 400 (a superior surface as viewed) is polished to the level of fin 4100 so that fin is exposed. FIG. 6 also shows the implanting of a dopant for the transistor device to be formed in the transistor body or fin. Representatively, dopant 415 is introduced into a designated channel region of the fin. Where the channel of a transistor device is to be doped to have a similar conductivity as corresponding source and drain of the device, the dopant may also be used to form or partially form the source and drain. FIG. 6 shows dopant 415 of, for example, arsenic for an n-type device or boron or phosphorous for a p-type device (block 320, FIG. 14).

Figure 7:
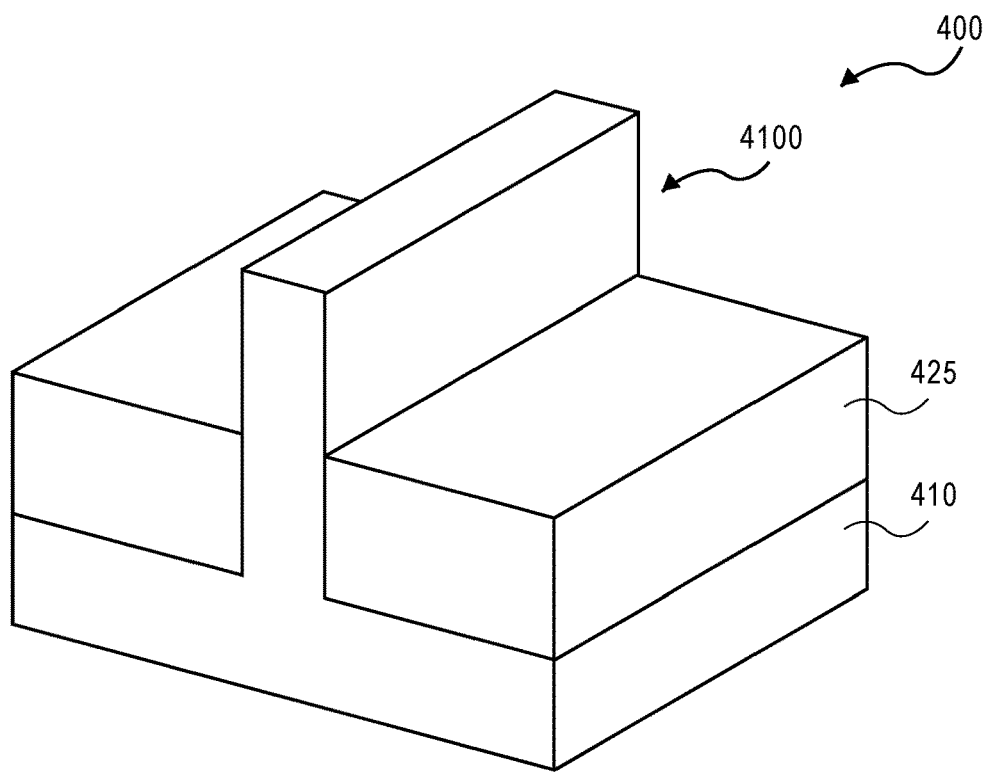
FIG. 7 shows the structure of FIG. 6 following a recession of a dielectric layer to expose the fin.
Figure 8:
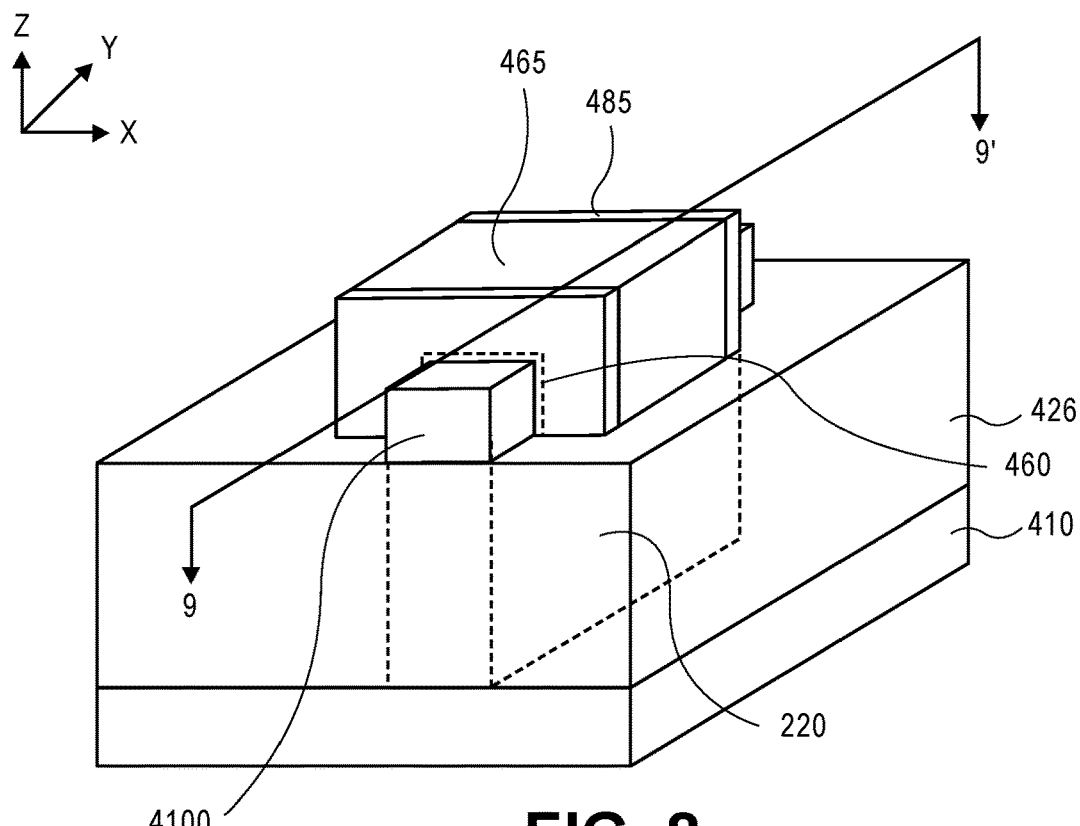
FIG. 8 shows the structure of FIG. 7 following the formation of a sacrificial or dummy gate stack on the fin.

FIG. 7 shows structure 400 of FIG. 6 following a recession of dielectric layer 425 to expose fin 4100. FIG. 8 shows structure 400 of FIG. 7 following the formation of a sacrificial or dummy gate stack on fin 4100 (block 525, FIG. 14). In one embodiment, a sacrificial or dummy gate stack includes gate dielectric 460 of, for example, silicon dioxide. Disposed on gate dielectric layer 460, in one embodiment, is dummy gate 465 of, for example, polysilicon deposited by, for example, a chemical vapor deposition process. In one embodiment, the sacrificial gate dielectric and subsequently, the sacrificial gate electrode may each be introduced as a blanket and patterned by etching to form the gate stack. Sidewalls spacers may then be added by depositing a dielectric layer and patterning the dielectric layer. FIG. 8 shows sidewall spacers 285 on opposite sides of the sacrificial gate stack.

Figure 9:
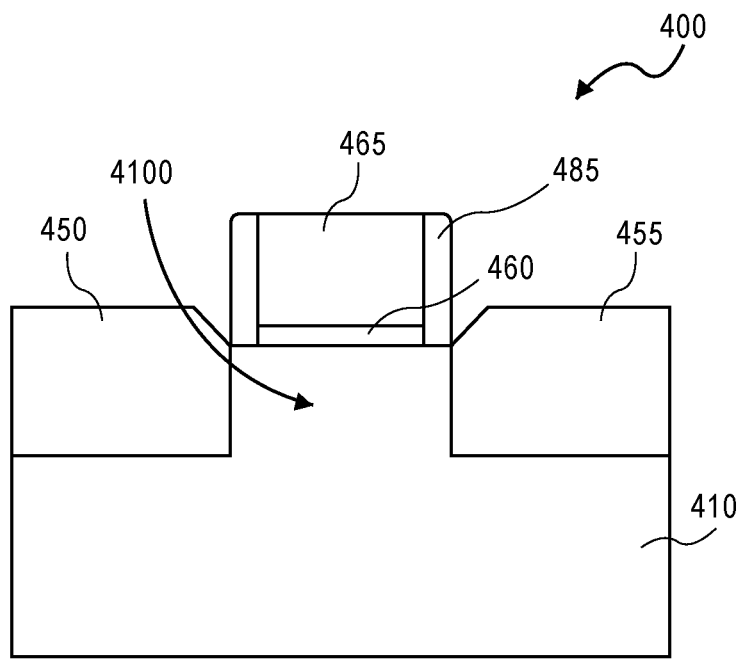
FIG. 9 shows the structure of FIG. 8 through line 9-9' showing the sacrificial or dummy gate stack and sidewall spacers following the formation of a source and a drain.

FIG. 9 shows structure 400 of FIG. 8 through line 9-9' showing the sacrificial or dummy gate stack on the channel region of fin 4100 and following the formation of a source and a drain. In one embodiment, source 450 and drain 455 are formed by the implantation of a dopant into diffusion regions of fin 4100. For a depletion device, source 450 and drain 455 are doped to have a similar conductivity as a channel of the device (if the channel is doped n-type, source 450 and drain 455 are doped n-type; if the channel is doped p-type, source 450 and drain 455 are doped p-type). Representatively, the implantation of a dopant such as an n-type dopant (e.g., arsenide) or a p-type (e.g., boron) is introduced at a higher concentration than a concentration of a similar dopant in a channel region of the device. In another embodiment, source 450 and drain 455 are formed by initially removing portions of fin 4100 in diffusion regions (source and drain regions) in the fin. Representatively, an etch undercut (EUC) is performed to remove portions of fin 4100 in regions corresponding to a source and a drain with dummy gate 465 and sidewalls spacers 485 protecting fin 4100 in a channel region. Following a removal of fin material in source and drain regions to leave voids, source 450 and drain 455 are formed in respective voids. In one embodiment, where fin 4100 is an n-type doped silicon, source 450 and drain 455 are n$^{++}$ silicon that may be epitaxially grown.

Figure 10:
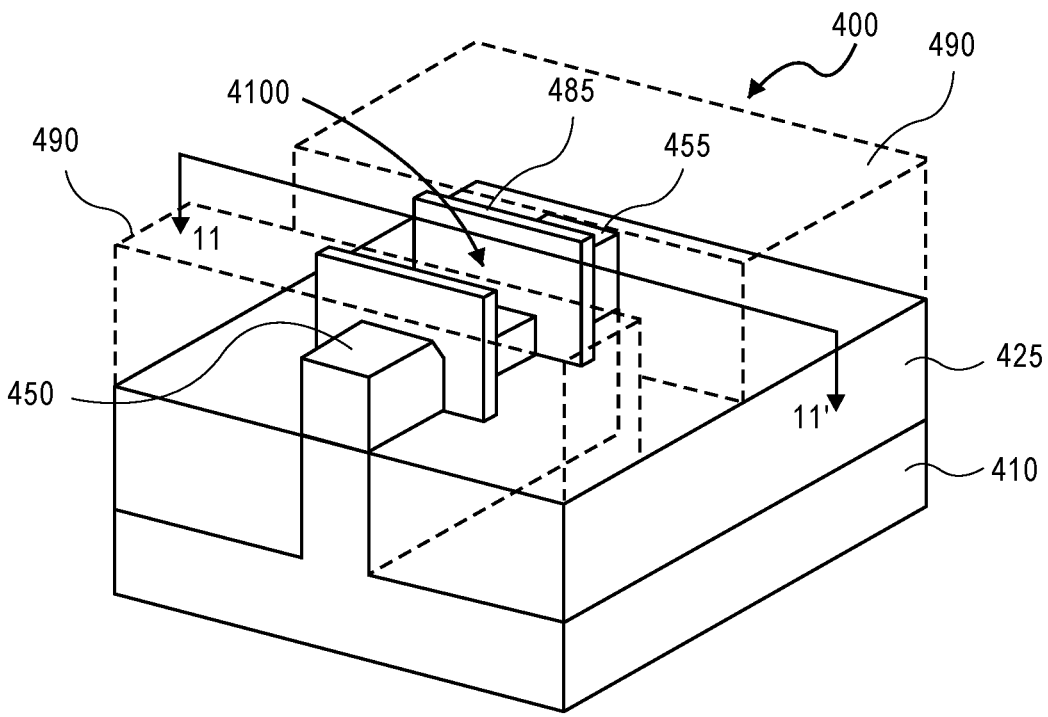
FIG. 10 shows a perspective view of structure 400 of FIG. 9 following an introduction of a dielectric material on the device and a removal of the sacrificial gate stack.

FIG. 10 shows a perspective view of structure 400 of FIG. 9 following the introduction of a dielectric material on the device and a removal of the sacrificial gate stack. In one embodiment, following a formation of source 450 and drain 455, dielectric material 490 is introduced on the structure (on a surface including source 450, drain 455 and dummy gate 465). In one embodiment, dielectric material 490 is silicon dioxide or a low-k material or a combination of material (e.g., low-k materials or silicon dioxide and one or more low-k materials). Dummy gate 465 and gate dielectric 460 are then removed by, for example, masking dielectric material 490 with an opening to expose the gate stack followed by an etch process to remove dummy gate 465 and gate dielectric 460. The sacrificial gate stack may be removed by a mask and etch process. The removal of the sacrificial gate stack exposes a channel region of fin 4100.

Figure 11:
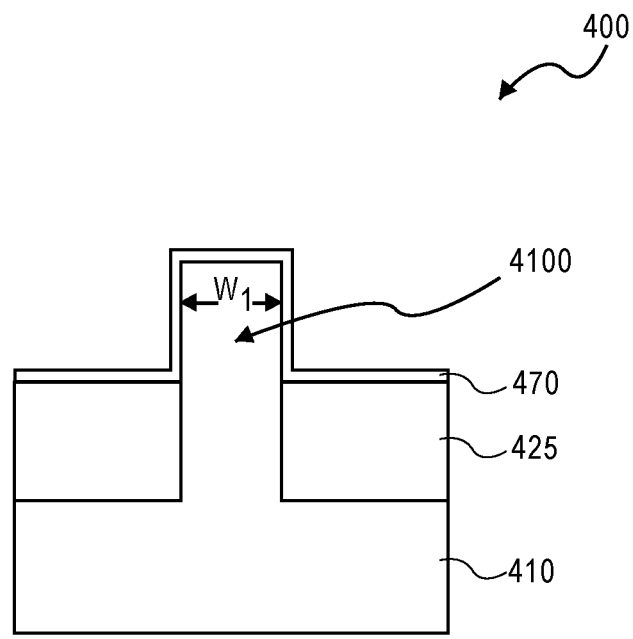
FIG. 11 shows the structure of FIG. 10 through line 11-11' following the introduction of an oxide layer on a channel region of the fin.

FIG. 11 shows the structure of FIG. 10 through line 11-11' following the introduction of an oxide on fin 4100 in the exposed channel region of the transistor device. In one embodiment, oxide 470 will be removed after a thermal oxidation. In another embodiment, oxide 470 (e.g., silicon dioxide) may be the gate oxide for the transistor device that is being formed. Representatively, oxide 470 is deposited to a thickness on the order of 1 nm to 5 nm (block 535, FIG. 14). Following the deposition of oxide 470 on fin 4100 in a channel region, structure 400 is annealed (block 540, FIG. 14). In one embodiment, structure 400 is subjected to a soak anneal that has the effect of narrowing a width dimension of the fin in the channel region. A representative temperature for the soak anneal is on the order of 400° C. to 600° C.

FIG. 12 shows the structure of FIG. 11 following a narrowing of a width dimension of the fin in the channel region and the formation of a gate stack on the channel region of the fin. FIG. 12 shows that fin 4100 is narrowed from an initial width, $W_1$, of greater than 10 nm to such as, for example, an average width, $W_2$, of 10 nm or less (e.g., 2 nm to 6 nm). FIG. 12 shows narrowed fin 4100 retaining a generally rectangular profile. It is appreciated that the thermal oxidation process may modify a shape of fin with, for example, portions along a height dimension oxidizing at a different rate than other portions. Similarly, a top portion of fin 4100 as viewed may be rounded or non-planar. In one embodiment, where it is desired that oxide 470 serve as a gate dielectric, a gate electrode material may be deposited on oxide 470. In another embodiment, oxide 470 may be replaced with another dielectric material 472 by, for example, removing oxide 470 (e.g., etching) and depositing, for example, a high-k material or another oxide layer or both. FIG. 13 shows a top perspective view of the structure including gate stack 475 deposited on the structure on a channel region of the device including a dielectric material on the structure.

Representative materials for gate electrode 475 include, but are not limited to, tungsten, tantalum, titanium for a nitride of such materials, a metal alloy or a silicide. As described, the gate stack of gate dielectric 470 and gate electrode 475 contacts at least two adjacent sides of fin 4100 (e.g., three sides). Following the formation of gate electrode 475, dielectric material may be introduced over the gate stack and then contacts may be made to source 450 and drain 455 and gate electrode 475 (block 550, FIG. 14).

Figure 15:
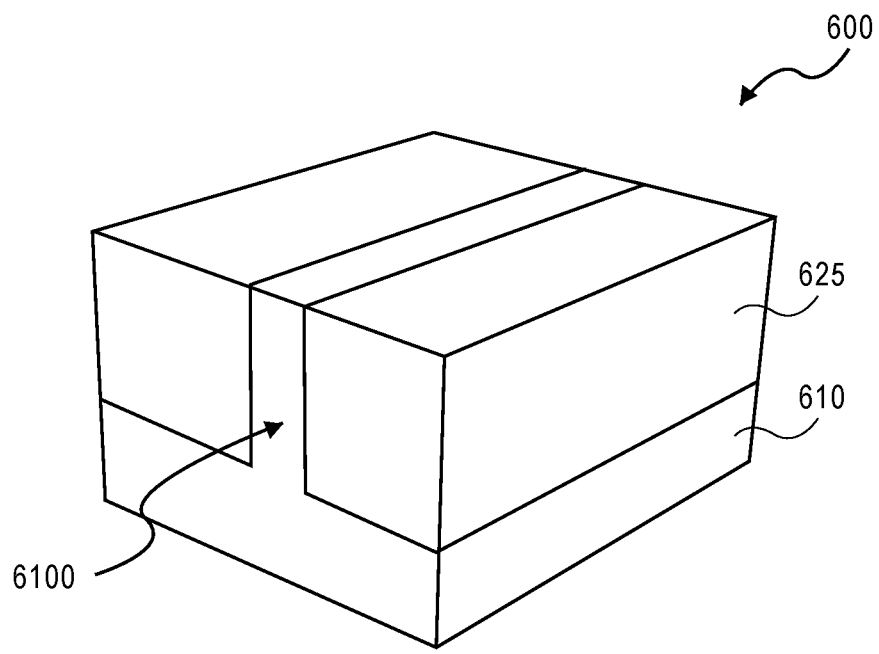
FIG. 15 shows a perspective side view of the structure that includes a substrate and having a sacrificial fin formed therein surrounded by dielectric material.
Figure 23:
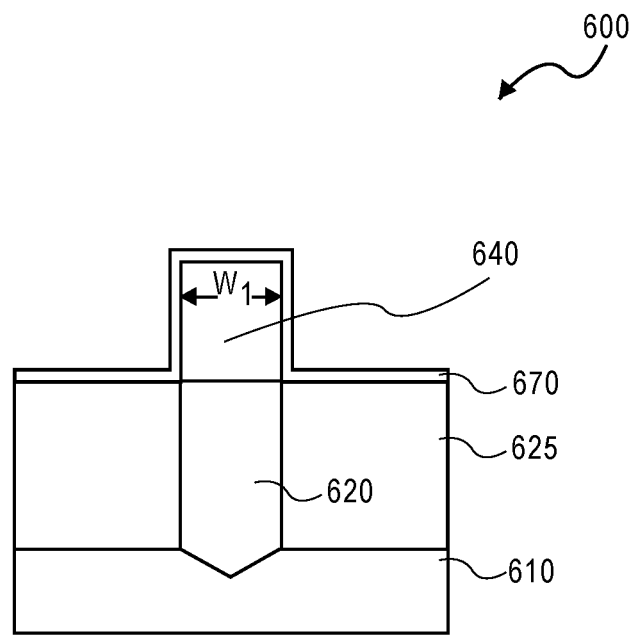
FIG. 23 shows the structure of FIG. 22 through line 23-23' following the deposition of an oxide layer on the channel region of the intrinsic layer.
Figure 24:
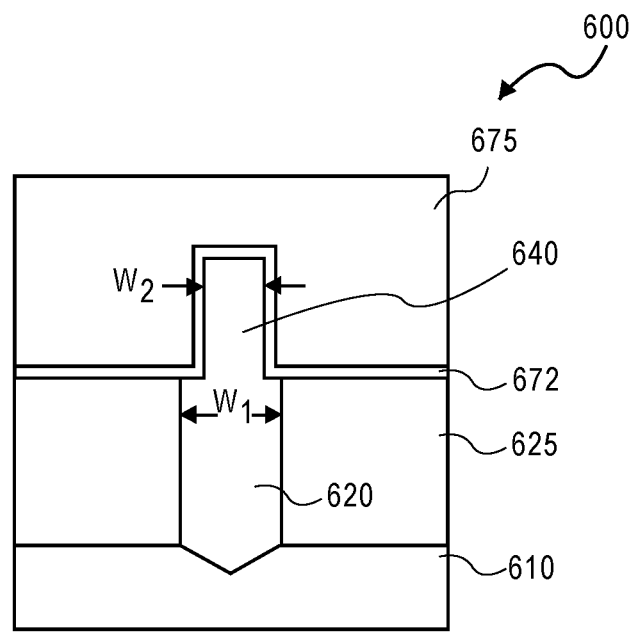
FIG. 24 shows the structure of FIG. 23 following an anneal to reduce a width of the fin and the formation of a gate stack on the fin.
Figure 25:
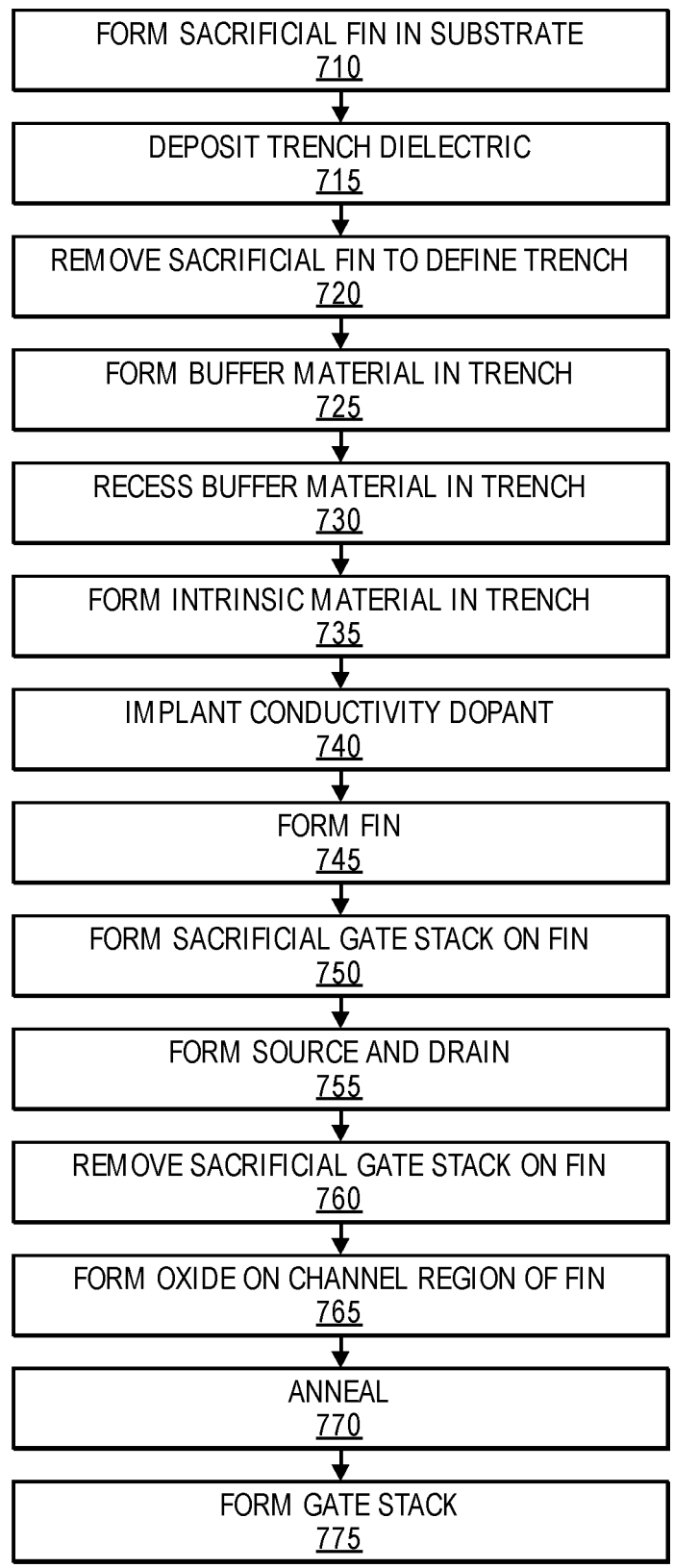
FIG. 25 presents a flow chart of the process.

In the above embodiment, the transistor body or fin of the transistor device is formed of a base material of the substrate (e.g., silicon). In another embodiment, the fin may be formed of a material other than the base material structure. Where the base material is silicon, other materials include germanium or group III-V compound semiconductor materials. FIGS. 15-24 describe an embodiment for forming a device with a channel material different than a base material of the substrate. FIG. 25 presents a flow chart of the process. Another embodiment of a three-dimensional multi-gate FET including a channel region having a similar conductivity as a source and drain of the transistor device allowing such transistor device to operate in a depletion mode is described. Referring to FIG. 15, FIG. 15 shows a perspective side view of structure 600 that includes substrate 610 that may serve as a foundation on which a multi-gate FET may be constructed. Substrate 610 may be a bulk substrate (e.g., silicon substrate) or, in another embodiment, a silicon on insulator (SOI) structure. FIG. 15 shows substrate 610 following a patterning of the substrate to define sacrificial fin 6100 and after forming a dielectric layer on the substrate (block 715, FIG. 25). The formation of the sacrificial fin and deposition of a trench dielectric layer may be similar to the formation described above for forming a fin in FIGS. 5 and 6. FIG. 15 shows sacrificial fin 6100 having dielectric layer 625 deposited on opposite sides thereof. In one embodiment, sacrificial fin 6100 has a height on the order of 100 nm to 400 nm. Following deposition of dielectric layer 625, a surface of the structure (a superior surface as viewed) is polished to a level of the top of sacrificial fin 6100 so that the fin is exposed.

Figure 16:
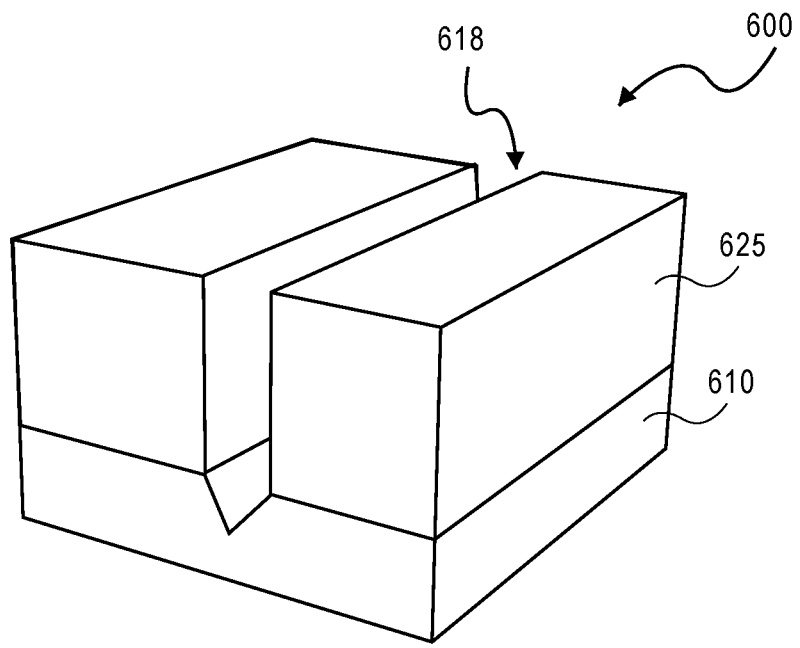
FIG. 16 shows the structure of FIG. 15 following the removal of the sacrificial fin to form a trench of a controlled size and shape.

FIG. 16 shows structure 600 of FIG. 15 following the removal of sacrificial fin 6100 to form a trench of a controlled size and shape (block 720, FIG. 25). The sacrificial fin may be removed by a mask and etch process. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fin forms trench 618. In one embodiment, the etching of the sacrificial fin may be performed to provide a {111} faceting at the bottom of trench 618 to facilitate a growth of a group III-V compound material in the trench. A TMAH or equivalent chemistry may be used to provide such faceting. Alternative geometries are also contemplated.

Figure 17:
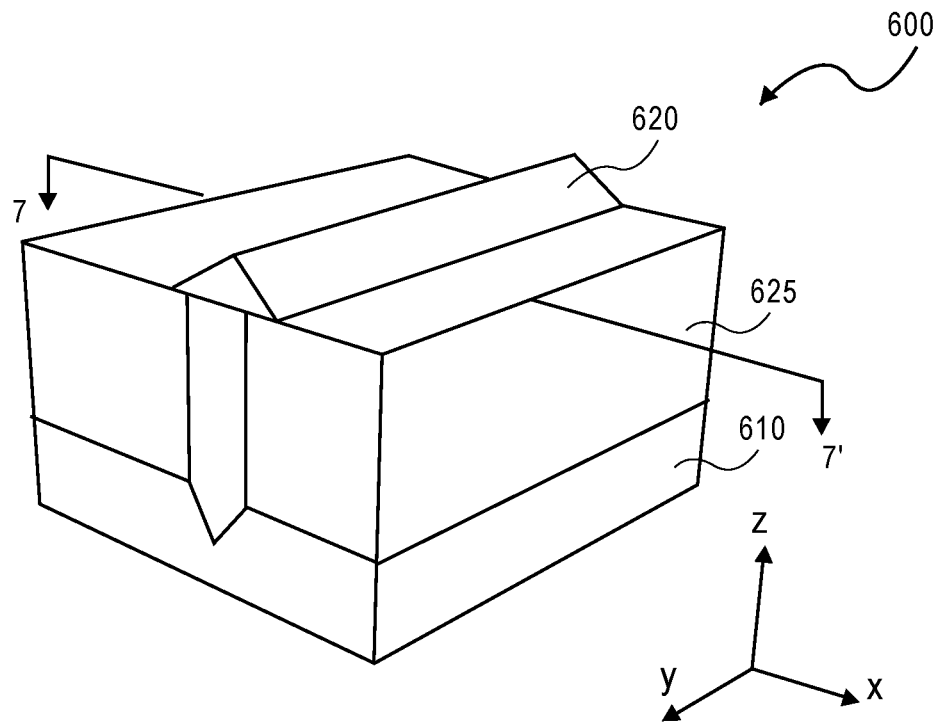
FIG. 17 shows the structure of FIG. 16 following the introduction of a buffer material in the trench.

FIG. 17 shows structure 600 of FIG. 16 following the introduction of a buffer material in trench 618 (block 725, FIG. 25). In one embodiment, buffer material 620 is a group III-V compound material such as, but not limited to, gallium arsenide (GaAs), indium phosphide (InP); silicon germanium (SiGe), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trench may be filled with a first buffer material of one of the noted materials as, for example, a nucleation layer at a base of trench 618 followed by a second buffer material of another of the noted materials. The trench confined growth of a buffer material or materials offer an advantage of aspect ratio trapping (ART) whereby crystalline quality of the epitaxial layer(s) is enhanced through trapping of threading dislocations, stacking faults, twins, etc., at sidewalls of a trench where defects terminate such that overlying material may be increasingly defect-free. FIG. 17 shows buffer material 620 filling trench 618. In this embodiment, buffer material 620 includes {111} faceted overgrowth protruding off a superior plane defined by dielectric layer 625.

Figure 18:
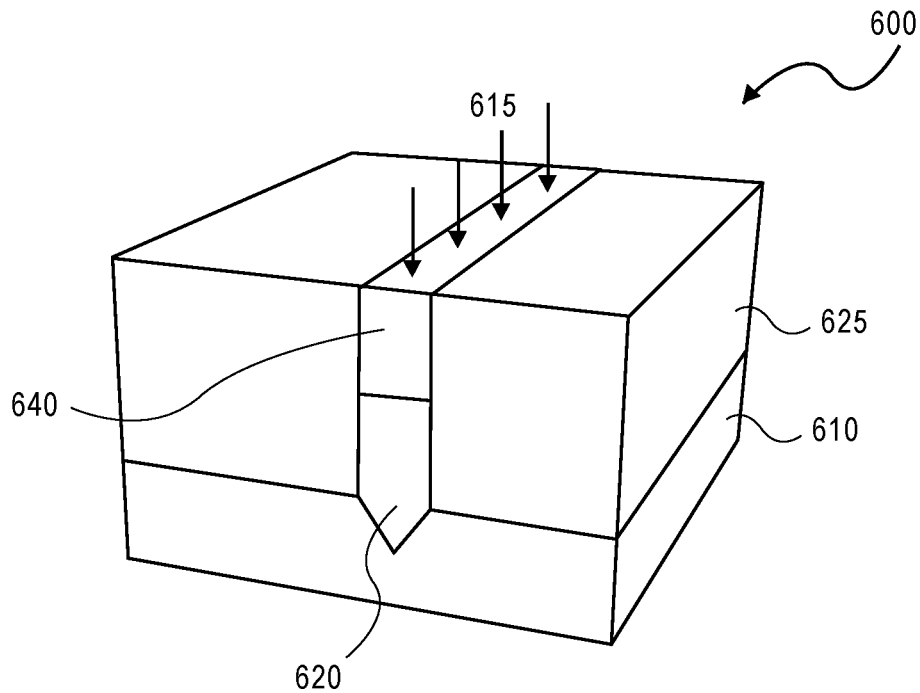
FIG. 18 shows the structure of FIG. 17 following a removal of a portion of the buffer material in the trench and the introduction of an intrinsic material into the trench.

FIG. 18 shows structure 600 of FIG. 17 following a removal of a portion of buffer material 620 in trench 618 and the introduction of an intrinsic material into the trench. In one embodiment, the removal of buffer material 620 is performed by an etch to recess the buffer material in the trench (block 730, FIG. 25). A suitable etchant for buffer material 620 is a peroxide/acid solution or an equivalent chemistry. FIG. 18 shows intrinsic layer 640 formed in trench 618 on buffer material 620 (block 735, FIG. 25). In one embodiment, intrinsic layer 640 is germanium. Intrinsic layer 640 has a representative height on the order of 40 nm to 100 nm.

Following the introduction of intrinsic layer 640 in trench 618, the structure may be planarized and then the intrinsic layer is doped with a dopant for a desired conductivity of a channel of the transistor device where intrinsic layer is a germanium material, a suitable dopant for a p-type device is, for example, boron or phosphorous. The dopant may be restricted to a channel region of a fin formed of intrinsic layer 640 or, since the transistor device will ultimately be formed with a conductivity of the channel being similar to a conductivity of the source and drain, the entire intrinsic layer may be doped with dopant 615 (block 740, FIG. 25).

Figure 19:
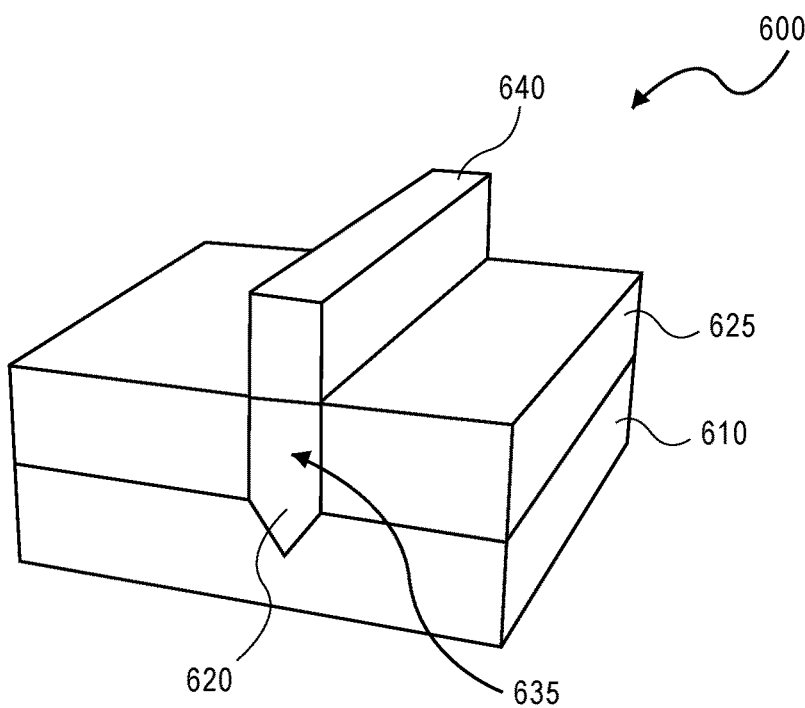
FIG. 19 shows the structure of FIG. 18 following a recession of the dielectric layer such that the intrinsic layer is protruding above a plane defined by the dielectric layer as a fin structure.

FIG. 19 shows structure 600 of FIG. 18 following a recession of dielectric layer 625 such that intrinsic layer 640 is protruding above a plane defined by dielectric layer 625 as a fin structure (block 745, FIG. 25). A representative height of the exposed fin is on the order of 500 angstroms (Å).

Figure 20:
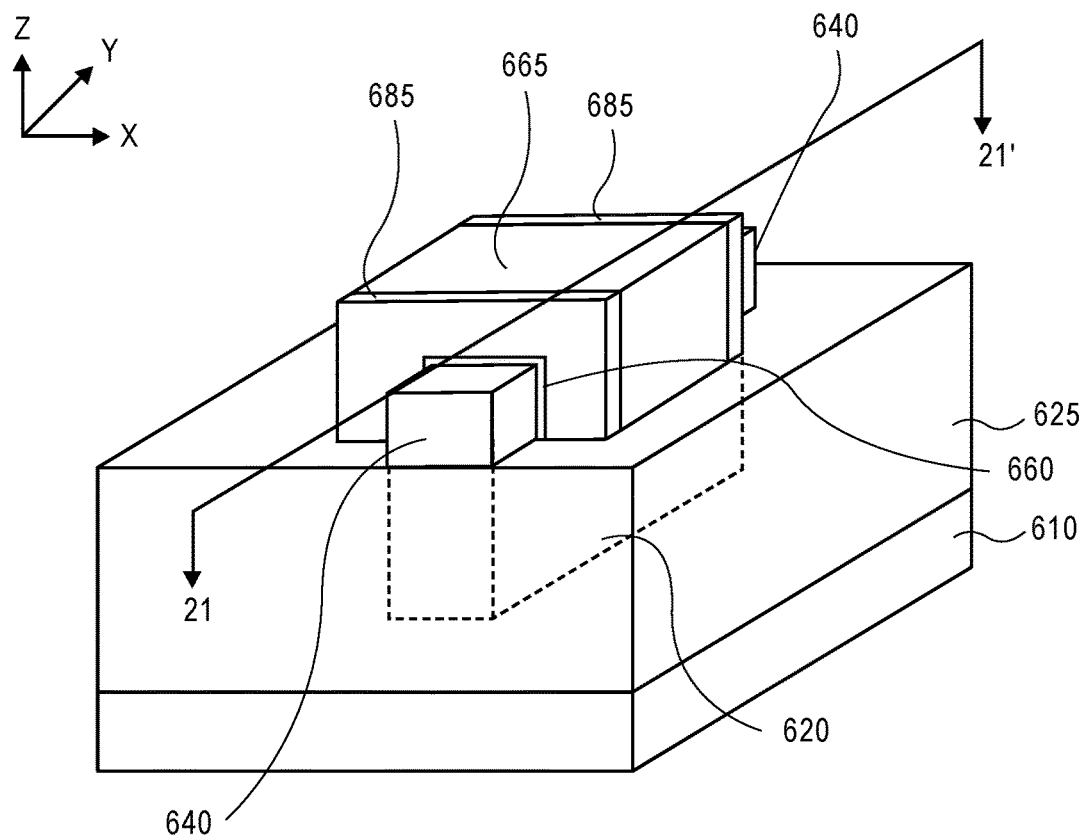
FIG. 20 shows the structure of FIG. 19 following the formation of a sacrificial gate stack on a channel region of the fin and the sidewalls spacer on the gate stack.

FIG. 20 shows a top side perspective view of structure 600 of FIG. 19 following the formation of a sacrificial or dummy gate stack on the fin of intrinsic layer 640 (block 750, FIG. 25). Similar to the embodiment described above, a gate stack includes gate dielectric layer 660 of, for example, silicon dioxide or a high-k dielectric material. Disposed on gate dielectric layer 660, in one embodiment, is dummy gate 665 of, for example, polysilicon. The formation of the dummy gate may be similar to the methods described above with reference to FIG. 8. Sidewall spacers 685 may optionally be formed on opposite sides of the sacrificial or dummy gate stack. FIG. 20 shows sidewalls spacer 685.

Figure 21:
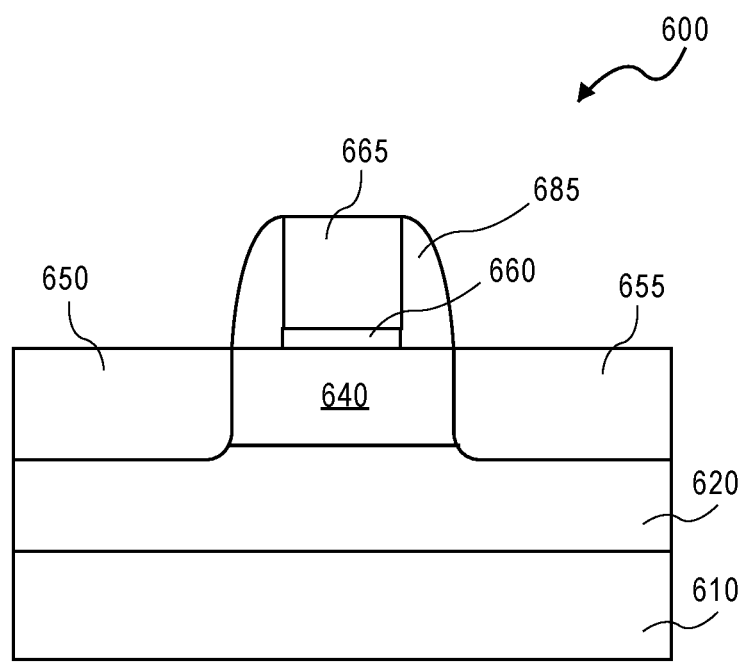
FIG. 21 shows the structure of FIG. 20 through line 21-21' showing the sacrificial or dummy gate stack on the fin and after forming a source and a drain on opposite sides of a channel region of the fin.

FIG. 21 shows structure 600 of FIG. 20 through line 21-21' showing the sacrificial or dummy gate stack of gate dielectric 660 and dummy gate stack 665 on the fin defined by intrinsic layer 640. FIG. 21 shows the structure following the formation of a source and a drain of the transistor device in intrinsic layer 640 (block 755, FIG. 25). In one embodiment, source 650 and drain 655 may be formed by implanting dopant into source 650 and drain 655. For germanium, a representative dopant is boron. In another embodiment, an etch under cut (EUC) may be performed to remove portions of intrinsic layer 640 and, following removal, forming source 650 and drain 655 by introducing (e.g., epitaxially) growing a material in the region. In one embodiment, where intrinsic layer 640 is germanium, source 650 and drain 655 are highly-doped germanium ($p^{++}$) such as boron-doped germanium that is epitaxially grown.

Figure 22:
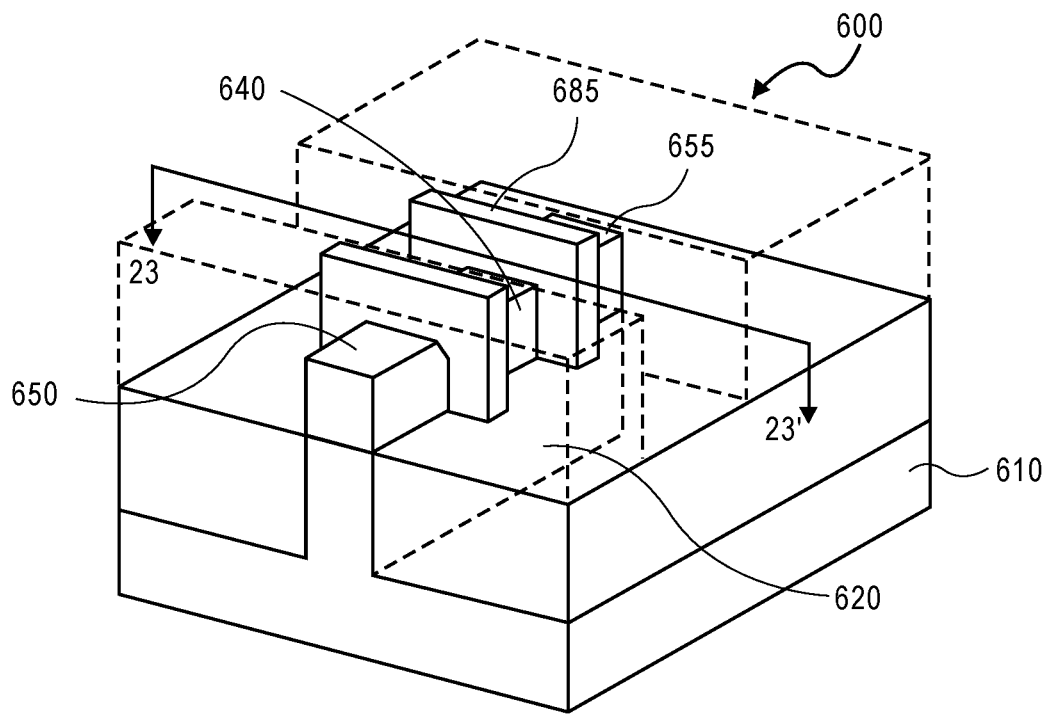
FIG. 22 shows a top perspective view of the structure of FIG. 21 following the introduction of a dielectric material on the device and the removal of sacrificial or dummy gate stack and the exposure of a channel region of the fin defined by the intrinsic layer.

FIG. 22 shows a top perspective view of the structure of FIG. 21 following the introduction of a dielectric material on the device and the removal of sacrificial or dummy gate stack and the exposure of a channel region of the fin defined by intrinsic layer 640. Sacrificial gate stack 665 and sacrificial gate dielectric layer 660 may be removed by, for example, a mask and etch process (block 760, FIG. 25). FIG. 23 shows the structure of FIG. 22 through line 23-23' following the deposition of an oxide layer on the channel region of intrinsic layer 640 (block 765, FIG. 25). FIG. 23 shows the fin defined by intrinsic layer 240 has a width, $W_1$, that is greater than 10 nm.

Following the introduction of oxide layer 670 on channel region of intrinsic layer 640, structure 600 is subjected to an anneal (such as a soak anneal). The soak anneal has the effect of oxidizing portions of intrinsic layer 640 in the channel region and thus reducing a width of the fin in that region (e.g., portions of a fin of germanium are oxidized at the edges of the fin thus reducing a width of germanium as fin material) (block 770, FIG. 25). FIG. 24 shows the structure of FIG. 23 following an anneal (e.g., a soak anneal) to narrow a width of the fin. FIG. 24 shows the fin portion of intrinsic layer 240 has an average width, $W_2$, after the anneal that is less than its width, $W_1$, prior to the anneal ($W_1$ is 10 nm or greater). In one embodiment, width, $W_2$, is less than 10 nm (e.g., 2 nm to 6 nm).

FIG. 24 shows the structure of FIG. 23 following the formation of a gate stack on the structure (block 775, FIG. 25). In one embodiment, oxide layer 670 is replaced with a gate dielectric of silicon dioxide or a high-k dielectric material or a combination of silicon dioxide and a high-k dielectric material. In one embodiment, gate electrode 675 is a material such as tungsten, tantalum, titanium or a nitride, allow or silicide. Contacts may then be made to the formed transistor as desired.

Figure 26:
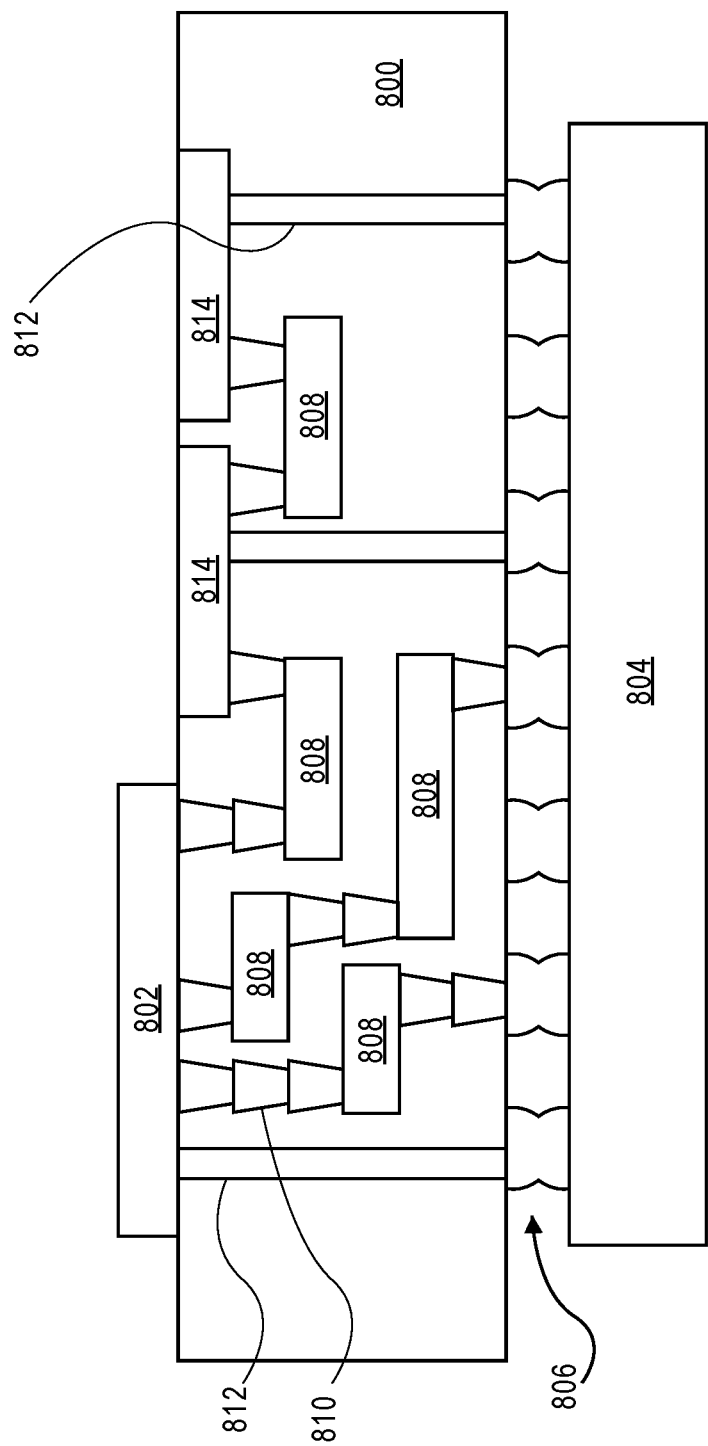
FIG. 26 is an interposer implementing one or more embodiments.

FIG. 26 illustrates interposer 800 that includes one or more embodiments. Interposer 800 is an intervening substrate used to bridge a first substrate 802 to second substrate 804. First substrate 802 may be, for instance, an integrated circuit die. Second substrate 804 may be, for instance, a memory module, a computer motherboard, or another integrated circuit die. Generally, the purpose of interposer 800 is to spread a connection to a wider pitch or to reroute a connection to a different connection. For example, interposer 800 may connect an integrated circuit die to ball grid array (BGA) 806 that can subsequently be connected to second substrate 804. In some embodiments, first and second substrates 802/804 are attached to opposing sides of interposer 800. In other embodiments, first and second substrates 802/804 are attached to the same side of interposer 800. In further embodiments, three or more substrates are interconnected by way of interposer 800.

Interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. Interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 800.

In accordance with embodiments, apparatuses or processes disclosed herein including high voltage depletion mode transistor may be used in the fabrication of interposer 800.

Figure 27:
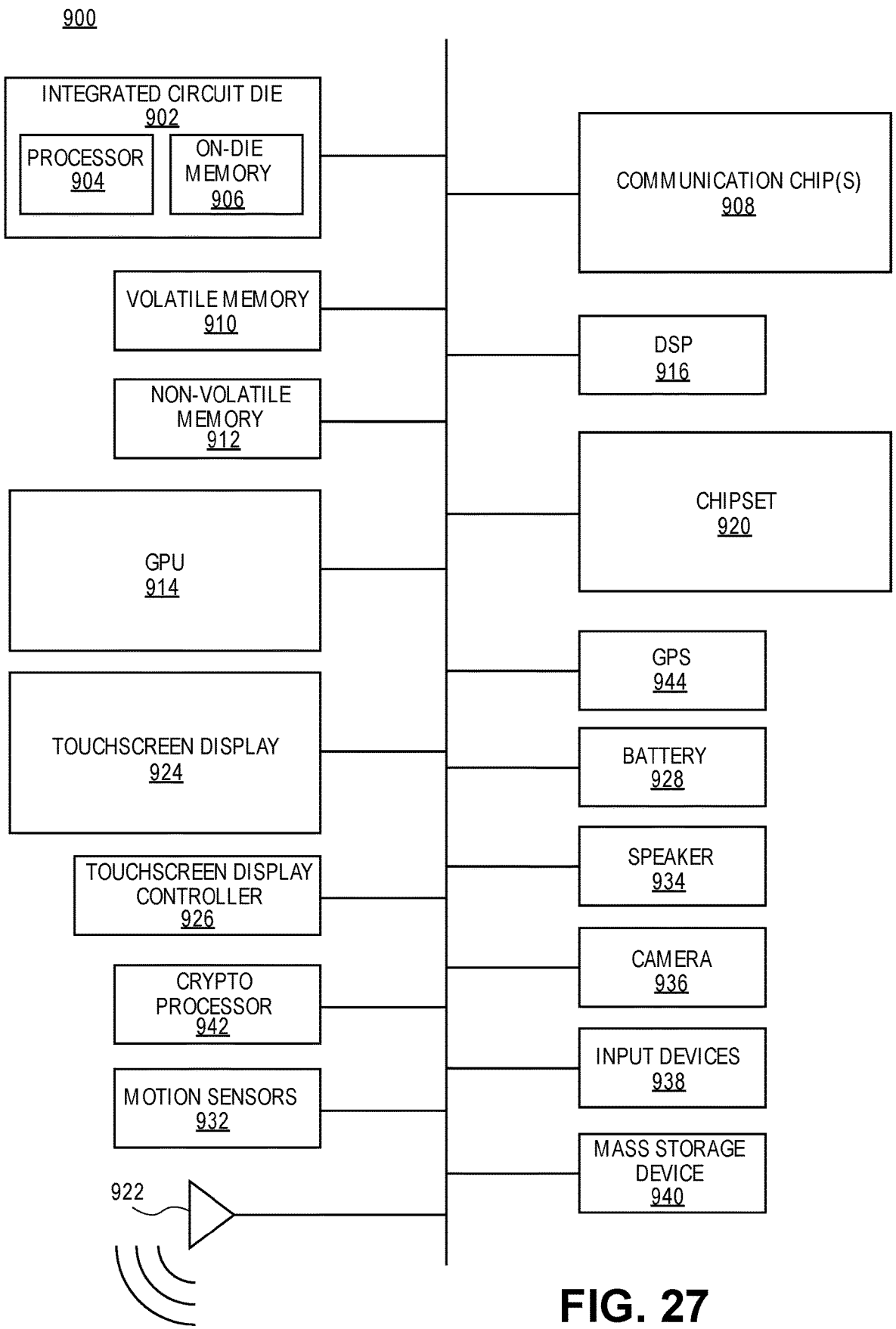
FIG. 27 illustrates an embodiment of a computing device.

FIG. 27 illustrates computing device 900 in accordance with one embodiment. Computing device 900 may include a number of components. In one embodiment, these components are attached to one or more motherboards. In an alternate embodiment, these components are fabricated onto a single system-on-a-chip (SoC) die rather than a motherboard. The components in computing device 900 include, but are not limited to, integrated circuit die 902 and at least one communication chip 908. In some implementations communication chip 908 is fabricated as part of integrated circuit die 902. Integrated circuit die 902 may include CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), graphics processing unit 914 (GPU), digital signal processor 916, crypto processor 942 (a specialized processor that executes cryptographic algorithms within hardware), chipset 920, antenna 922, display or a touchscreen display 924, touchscreen controller 926, battery 928 or other power source, a power amplifier (not shown), global positioning system (GPS) device 944, compass 930, motion coprocessor or sensors 932 (that may include an accelerometer, a gyroscope, and a compass), speaker 934, camera 936, user input devices 938 (such as a keyboard, mouse, stylus, and touchpad), and mass storage device 940 (such as hard disk drive, compact disk (CD), digital versatile disk (DVD), and so forth).

Communications chip 908 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 908. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 904 of computing device 900 includes one or more devices, such as high voltage depletion mode transistors, that are formed in accordance with embodiments presented above. The term "processor" may refer to any device or portion of a device that processes electronic data from registers and/or memory to transform that electronic data into other electronic data that may be stored in registers and/or memory.

Communication chip 908 may also include one or more devices, such as voltage depletion mode transistors, that are formed in accordance with embodiments presented above.

In further embodiments, another component housed within computing device 900 may contain one or more devices, such as voltage depletion mode transistors, that are formed in accordance with implementations presented above.

In various embodiments, computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 900 may be any other electronic device that processes data.

EXAMPLES

Example 1 is a transistor device including a body disposed on a substrate, a gate stack contacting at least two adjacent sides of the body and a source and a drain on opposing sides of the gate stack and a channel defined in the body between the source and the drain, wherein a conductivity of the channel is similar to a conductivity of the source and the drain, and wherein the transistor device is conductive when a gate source voltage is zero.

In Example 2, the channel of the transistor device of Example 1 includes a width between opposing sidewalls of the gate stack of less than 10 nanometers.

In Example 3, the channel of the transistor device of Example 1 includes a width between opposing sidewalls of the gate stack of 2 nanometers to 6 nanometers.

In Example 4, the channel of the transistor device of Example 1 includes a length measured between the source and the drain of 100 microns or greater.

In Example 5, the transistor device of Example 1 further includes a logic circuit and a pad operable for connection to an external device, wherein the transistor includes an interface between the logic circuit and the pad.

Example 6 is an input/output (IO) circuit including a logic circuit; a driver circuit coupled to the logic circuit, the driver circuit including at least one transistor device including a body disposed on a substrate, a gate stack contacting at least two adjacent sides of the body and a source and a drain on opposing sides of the gate stack and a channel defined in the body between the source and the drain, wherein a conductivity of the channel is similar to a conductivity of the source and the drain; and a pad coupled to the driver circuit, the pad operable for connection to an external device.

In Example 7, the at least one transistor of the IO circuit of Example 6 is conductive when a gate source voltage is zero.

In Example 8, the body of the transistor of the IO circuit of Example 6 includes a width between opposing sidewalls of the gate stack of less than 10 nanometers.

In Example 9, the channel of the IO circuit of Example 6 includes a width between opposing sidewalls of the gate stack of 2 nanometers to 6 nanometers.

In Example 10, the channel of the transistor of the IO circuit of any of Examples 6-9 has a length measured between the source and the drain of 100 microns or greater.

Example 11 is a method of forming a transistor device including forming a channel on a substrate; doping the channel with an amount of atoms to establish an electrical conductivity; forming a source on the substrate on a first side of the channel and a drain on the substrate on a second side of the channel, wherein the first side is opposite the second side, wherein the source and the drain include the same electrical conductivity as the channel; and forming a gate stack on the channel, the gate stack including a gate dielectric and a gate electrode.

In Example 12, forming a channel of the body of Example 11 includes forming a body on the substrate with an initial width and reducing the initial width to a reduced width.

In Example 13, the reduced width of the body of Example 11 includes a width of less than 10 nanometers.

In Example 14, the reduced width of the body of Example 12 includes a width of 2 nanometers to 6 nanometers.

In Example 15, the length of the body of any of Examples 8-11 measured between the source and the drain is 100 microns or greater.

In Example 16, prior to forming a gate stack of the channel, the method of any of Examples 8-12 includes oxidizing a portion of a material of the channel.

In Example 17, oxidizing a portion of a material of the channel of the method of Example 16 includes depositing an oxide material on the channel and annealing the channel.

In Example 18, after oxidizing a portion of a material of the channel, the method of Example 17 includes removing the oxide material.

In Example 19, forming a channel of the method of any of Examples 11-18 includes forming a body of channel material projecting above a dielectric layer on the substrate.

In Example 20, forming a gate stack on the channel of the method of Example 19 includes forming a gate stack to contact at least two adjacent sides of the body of channel material.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A transistor device comprising:
a body disposed on a substrate, a gate stack contacting at least two adjacent sides of the body and a source and a drain on opposing sides of the gate stack and a channel defined in the body between the source and the drain, wherein a conductivity of the channel is similar to a conductivity of the source and the drain, and wherein the transistor device is conductive when a gate source voltage is zero.

2. The transistor device of claim 1, wherein the channel comprises a width between opposing sidewalls of the gate stack of less than 10 nanometers.

3. The transistor device of claim 1, wherein the channel comprises a width between opposing sidewalls of the gate stack of 2 nanometers to 6 nanometers.

4. The transistor device of claim 1, wherein the channel comprises a length measured between the source and the drain of 100 microns or greater.

5. The transistor device of claim 1, further comprising a logic circuit and a pad operable for connection to an external device, wherein the transistor comprises an interface between the logic circuit and the pad.

6. An input/output (TO) circuit comprising:
a logic circuit;
a driver circuit coupled to the logic circuit, the driver circuit comprising at least one transistor device comprising a body disposed on a substrate, a gate stack contacting at least two adjacent sides of the body and a source and a drain on opposing sides of the gate stack and a channel defined in the body between the source and the drain, wherein a conductivity of the channel is similar to a conductivity of the source and the drain; and
a pad coupled to the driver circuit, the pad operable for connection to an external device.

7. The IO circuit of claim 6, wherein the at least one transistor is conductive when a gate source voltage is zero.

8. The IO circuit of claim 6, wherein body of the transistor comprises a width between opposing sidewalls of the gate stack of less than 10 nanometers.

9. The IO circuit of claim 6, wherein the channel comprises a width between opposing sidewalls of the gate stack of 2 nanometers to 6 nanometers.

10. The IO circuit of claim 6, wherein the channel of the transistor has a length measured between the source and the drain of 100 microns or greater.

* * * * *